(12) United States Patent
Chen et al.

(10) Patent No.: US 6,660,577 B2
(45) Date of Patent: Dec. 9, 2003

(54) METHOD FOR FABRICATING METAL GATES IN DEEP SUB-MICRON DEVICES

(75) Inventors: Sheng-Hsiung Chen, Taichung (TW); Ming-Hsing Tsai, Taipei (TW)

(73) Assignee: Taiwan Semiconductor Manufacturing Co. Ltd, Hsin Chu (TW)

( * ) Notice: Subject to any disclaimer, the term of this patent is extended or adjusted under 35 U.S.C. 154(b) by 52 days.

(21) Appl. No.: 10/083,277

(22) Filed: Feb. 23, 2002

(65) Prior Publication Data

US 2003/0162342 A1 Aug. 28, 2003

(51) Int. Cl.[7] ................ H01L 21/8249; H01L 21/3205; H01L 21/44; H01L 29/76; H01L 31/062
(52) U.S. Cl. ................ 438/199; 438/585; 438/658; 438/660; 438/685; 257/407; 257/412
(58) Field of Search ................ 438/199, 229–232, 438/585, 658, 660, 685; 257/407, 412

(56) References Cited

U.S. PATENT DOCUMENTS

| | | | | |
|---|---|---|---|---|
| 5,654,242 A | * | 8/1997 | Komatsu | 438/585 |
| 6,027,961 A | * | 2/2000 | Maiti et al. | 438/199 |
| 6,130,123 A | * | 10/2000 | Liang et al. | 438/217 |
| 6,365,450 B1 | * | 4/2002 | Kim | 438/216 |
| 6,506,676 B2 | * | 1/2003 | Park et al. | 438/683 |
| 2002/0151125 A1 | * | 10/2002 | Kim et al. | 438/199 |

* cited by examiner

Primary Examiner—Mary Wilczewski
Assistant Examiner—Toniae M. Thomas
(74) Attorney, Agent, or Firm—Tung & Associates

(57) ABSTRACT

A method for fabricating metal gates in deep sub-micron CMOS devices. The method blanket deposits a transition metal nitride layer on top of a gate dielectric layer for forming gate electrodes for both a PMOS and an NMOS device. After a cap layer is deposited on top of the gate electrode for PMOS, a rapid thermal annealing process is carried out to drive out nitrogen from the transition metal nitride on top of the NMOS. Gate electrodes having different work functions on top of the PMOS and NMOS are thus achieved simultaneously by the same fabrication process.

13 Claims, 1 Drawing Sheet

METHOD FOR FABRICATING METAL GATES IN DEEP SUB-MICRON DEVICES

FIELD OF THE INVENTION

The present invention generally relates to a semiconductor fabrication technique for forming metal gates and more particularly, relates to a method for fabricating metal gates in deep sub-micron devices such as CMOS with substantially reduced fabrication steps.

BACKGROUND OF THE INVENTION

In the recent trend of continuing size reductions in semiconductor fabrication, the application of CMOS devices has been the main development trend to fulfill the size reduction requirement. In fabricating a CMOS device that consists of a PMOS and an NMOS, the fabrication steps are complicated in order to produce gate electrodes meeting different requirements for the PMOS and NMOS. To achieve a stable threshold voltage for the CMOS device, the gate electrodes that must be formed on the n-type semiconductor base for the PMOS and on the p-type semiconductor base for the NMOS must be fabricated of different materials. The different materials required in forming the gate electrodes for the PMOS and the NMOS necessarily increase the fabrication steps for deposition, lithography and etching.

For instance, in the fabrication of a PMOS, the electrically conductive material used in forming the gate electrodes must have a work function in-between the values of 4.8–5.5 eV. On the other hand, the electrically conductive material used in forming the gate electrodes for the NMOS must have a work function in-between 4.0–4.5 eV. In the present available technology wherein a polysilicon gate material is utilized in forming sub-micron devices, implantation density can be adjusted in doping the polysilicon gates for the PMOS and NMOS by using a series of photoresist layers as masks. However, when future deep sub-micron devices are designed with metal gate electrodes replacing the polysilicon gate electrodes, the fabrication processes required for different metals that have different work functions is much more complicated. For instance, the use of two different metals for the gate electrodes requires two separate deposition processes, two separate photomasking and photoresist patterning, two separate etching processes for patterning, two separate steps for removing photoresist layers, and two separate cleaning/rinse procedures, etc. The complicated processes lead to high cost and low yield which are not acceptable in designing a modern fabrication process.

It is therefore an object of the present invention to provide a method for fabricating metal gates for deep sub-micron CMOS devices that does not have the drawbacks or shortcomings of the conventional methods.

It is another object of the present invention to provide method for fabricating metal gates for deep sub-micron CMOS devices that has substantially reduced processing steps.

It is a further object of the present invention to provide a method for fabricating metal gates for deep sub-micron CMOS devices by using a pure metal and a metal nitride that have different work functions as the gate electrode materials.

It is another further object of the present invention to provide a method for fabricating metal gates for deep sub-micron CMOS devices wherein a transition metal nitride is used for forming the gate electrode for PMOS while pure transition metal is used in forming gate electrode for NMOS.

It is still another object of the present invention to provide a method for fabricating metal gates for deep sub-micron CMOS devices which only requires a single metal deposition, a single masking, a single photoresist patterning and a single etching process.

SUMMARY OF THE INVENTION

In accordance with the present invention, a method for fabricating metal gates in deep sub-micron CMOS devices is provided.

In a preferred embodiment, a method for fabricating metal gates in deep sub-micron CMOS devices can be carried out by the operating steps of providing a pre-processed silicon substrate that has an active area formed on a top surface, the active area includes a PMOS and an NMOS; depositing a gate dielectric layer on the active area of the silicon substrate; blanket depositing a transition metal nitride on the top surface of the substrate; patterning the transition metal nitride to cover the gate dielectric layer only; depositing and patterning a cap layer on top of the PMOS; annealing the substrate by a rapid thermal process at a temperature between about 300° C. and about 700° C., whereby nitrogen evaporates away from the transition metal nitride that is not shielded by the cap layer such that only a transition metal covers the NMOS; and removing the cap layer from top of the PMOS.

The method for fabricating metal gates in deep sub-micron CMOS devices may further include the step of, after removing the cap layer from top of the PMOS, planarizing the transition metal nitride layer and the transition metal layer by chemical mechanical polishing. The gate dielectric layer deposited may be silicon oxide, silicon oxynitride or silicon nitride. The transition metal nitride may be deposited by a physical vapor deposition technique. The transition metal nitride may be $WN_x$. The transition metal nitride may also be deposited by a chemical vapor deposition technique. The cap layer may be deposited by a plasma enhanced chemical vapor deposition technique from a material of $Si_3N_4$, SiC, $SiO_2$ or SiON.

In the method for fabricating metal gates in deep sub-micron CMOS devices, the rapid thermal process carried out for annealing the transition metal nitride layer may be conducted in vacuum at a temperature preferably between about 350° C. and about 600° C., and more preferably between about 400° C. and about 500° C. The rapid thermal process may be carried out in an environment of inert gas, such as $N_2$, He or Ar. The rapid thermal process may be carried out for a time period between about 1.5 min. and about 20 min. The gate electrode material may include all transition metals such as Sc, Ti, V, Cr, Mn, Fe, Co, Ni, Cu, Y, Cr, Nb, Mo, Tc, Ru, Rh, Pd, Ag, La, Hf, Ta, W, Re, Os, Ir, Pt and Au.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1A:
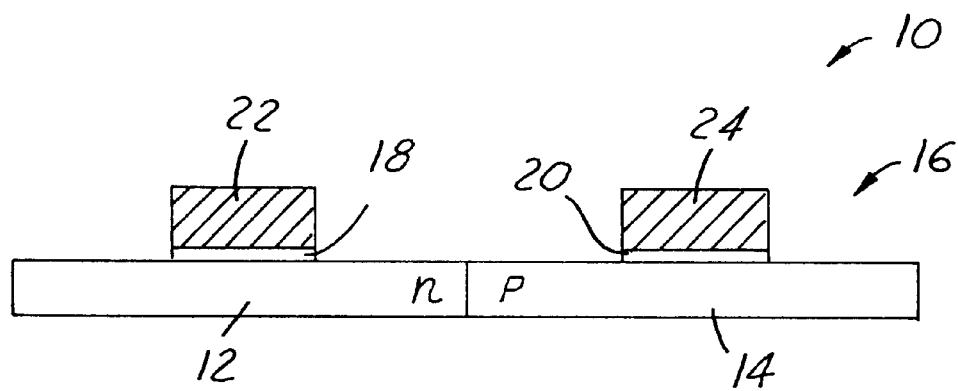
FIG. 1A is an enlarged, cross-sectional view of the present invention deep sub-micron CMOS device with transition metal nitride gate electrodes formed on top of a PMOS and an NMOS.

The present invention discloses a method for fabricating metal gates in deep sub-micron CMOS devices by utilizing a transition metal nitride and a pure transition metal as the gate electrode materials for a PMOS and NMOS device, respectively.

It is the unique discovery of the invention that by using a transition metal nitride and a pure transition metal which have different work functions, it is only necessary to deposit a transition metal nitride on the PMOS and NMOS devices, covering the PMOS with a cap layer and then, rapid thermal annealing the devices to change the transition metal nitride on top of the NMOS to pure transition metal. Based on the principle that a pure transition metal and a transition metal nitride have different work functions, only a single deposition step for the transition metal nitride is necessary. Since the transition metal nitride has a higher work function, it can be used as the conductive material for the PMOS gate electrode. The present invention unique process covers the transition metal nitride on the PMOS with a cap layer, and then annealing by rapid thermal process while the gate electrode on PMOS is protected by the cap layer. Simultaneously, since the transition metal nitride on top of the NMOS is not protected, i.e. or shielded by the cap layer, nitrogen evaporates and escapes from the transition metal nitride during the rapid thermal annealing process to turn into a pure transition metal. A gate electrode that has lower work function for the NMOS is thus achieved.

The present invention novel process therefore only requires a single deposition step, i.e. for depositing a transition metal nitride layer as the gate electrode; a single cap layer, i.e. on top of the PMOS device for protecting the PMOS gate electrode during rapid thermal annealing; a single patterning process; a single etching process and a single clean/rinse process. The only additional step required is the annealing step of the rapid thermal process. The present invention novel method can therefore be easily adapted into a fabrication process for deep sub-micron CMOS manufacturing technology.

While the present invention process can be adapted in various gate electrode fabrication processes, it is particularly useful for a deep sub-micron CMOS process in which both a PMOS and an NMOS are present in the silicon substrate. Contrary to the conventional process, the present invention method forms the gate electrodes on top of the PMOS and the NMOS simultaneously and thus, saving numerous fabrication steps.

The present invention novel process can be carried out by the operating steps of:
1. On top of a pre-processed silicon substrate, a gate dielectric layer is first formed on an active area of the substrate. The gate dielectric layer can be advantageously formed of a gate oxide layer or a high dielectric constant material layer.
2. A transition metal nitride is then blanket deposited on top of the silicon substrate. The transition metal can be selected from Sc, Ti, V, Cr, Mn, Fe, Co, Ni, Cu, Y, Cr, Nb, Mo, Tc, Ru, Rh, Pd, Ag, La, Hf, Ta, W, Re, Os, Ir, Pt and Au.
3. The transition metal nitride is then patterned to only cover the gate dielectric layer.
4. A cap layer such as SiON, $SiC_2$, $Si_3N_4$ or SiC is then deposited and patterned on the PMOS device to protect the PMOS gate electrode during annealing.
5. A rapid thermal annealing process is then carried out in a temperature range between about 300° C. and about 700° C., preferably between about 350° C. and about 600° C., and more preferably between about 400° C. and about 500° C. The RTP annealing process evaporates $N_2$ from the transition metal nitride on top of the NMOS and thus, converts the transition metal nitride to a pure transition metal that has a lower work function.

The present invention further allows an adjustment in the work function of the transition metal nitride by adjusting the nitrogen content in the transition metal nitride. The present invention method therefore allows the fabrication of gate electrodes for the PMOS and NMOS in the same process, eliminating numerous processing steps otherwise required in a conventional CMOS manufacturing process.

Referring now to FIG. 1A, wherein a present invention silicon substrate 10 is shown. The silicon substrate 10 consists of an n-doped silicon region 12 and a p-doped silicon region 14. A CMOS device 16 can thus be formed. On top of the CMOS device 16, is first deposited a gate dielectric layer (not shown) and then patterned into gate dielectric 18 and 20 for the NMOS and PMOS, respectively. On top of the gate dielectric layer is then deposited a transition metal nitride layer which is photolithographically formed into gate electrode 22,24 for the NMOS and PMOS, respectively.

The gate dielectric layer can be formed of any suitable gate dielectric material such as $SiO_2$, $Si_3N$ or SiON. The transition metal nitride can be formed of any transition metal selected from the group consisting of Sc, Ti, V, Cr, Mn, Fe, Co, Ni, Cu, Y, Cr, Nb, Mo, Tc, Ru, Rh, Pd, Ag, La, Hf, Ta, W, Re, Os, Ir, Pt and Au. In a preferred embodiment, the material of $WN_x$ is used as the transition metal nitride. $WN_x$ is selected for its superior surface properties and adhesion with $SiO_2$. While $WN_x$ can be deposited by either a physical vapor deposition or a chemical vapor deposition technique, the chemical vapor deposition technique is more preferred.

When $WN_x$ is deposited by a chemical vapor deposition technique, a plasma enhanced CVD method utilizing $WF_6$ and $NH_3$ is carried out. Alternatively, the precursors of $W(CO)_6$ and $NH_3$ may also be used. The physical vapor deposition technique is carried out in an inert gas environment of $Ar/N_2$ by using a W target.

Figure 1B:
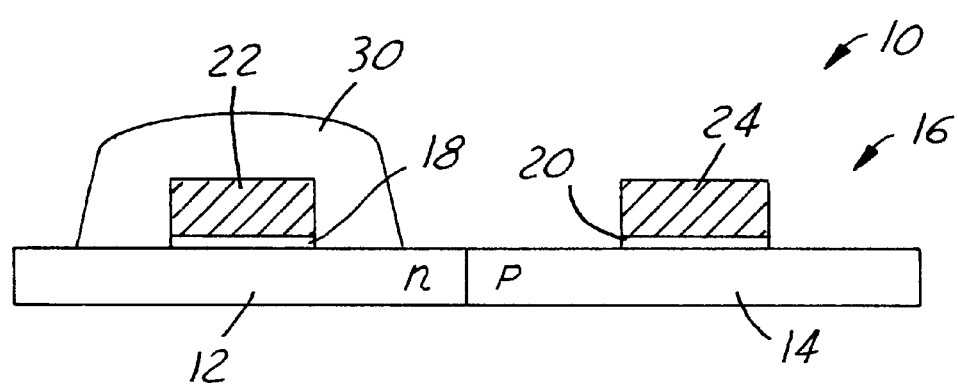
FIG. 1B is an enlarged, cross-sectional view of the present invention deep sub-micron CMOS device of FIG. 1A with a cap layer deposited on the PMOS and the substrate annealed in a rapid thermal process.

In the next step of the process, as shown in FIG. 1B, a protective layer or a cap layer 30 is deposited to enclose the PMOS device, i.e. the PMOS gate electrode 22. The cap layer 30 may be deposited by a plasma enhanced chemical vapor deposition technique with a material such as $Si_3N_4$, $SiO_2$, SiC or SiON. The purpose of the cap layer 30 is to shield the gate electrode 22 of the PMOS device during the rapid thermal annealing process. The rapid thermal annealing process can be carried out at a temperature between about 300° C. and about 700° C., and preferably between about 400° C. and about 600° C. The rapid thermal annealing process drives the nitrogen content in the transition metal nitride that forms the gate electrode 24 out and thus, converting the transition metal nitride into a pure transition metal. The rapid thermal annealing process should be carried out either in a vacuum, or in an inert gas environment such as $N_2$, Ar or He. A suitable time period for the rapid thermal annealing process is between about 1.5 min. and about 20 min.

In the last step of the process, the cap layer 30 is removed to thus obtain a PMOS gate electrode 40 and an NMOS gate electrode 50.

The present invention utilizes a unique conversion of a transition metal nitride to a pure transition metal and thus, changing the work function value of the transition metal nitride. For instance, as shown below in Table 1:

TABLE 1

| Gate Material | Work Function (eV) |
|---|---|
| Ti | 4.17, 4.33 |
| TiN | 4.95 |
| Zr | 4.05 |
| ZrN | 4.6 |
| Ta | 4.25, 4.6 |
| TaN | 5.41 |
| Nb | 4.3 |
| NbN | — |
| W | 4.55 |
| WN | 5 |
| Mo | 4.64, 4.53 |
| MoN | 5.33 |

By utilizing the present invention novel method, a gate electrode that has a specifically designed work function can be formed by a rapid thermal annealing process. For instance, in the preferred embodiment, on top of the N-type silicon region 12 (for PMOS), the gate electrode material of $WN_x$ has a higher work function of about 5 eV. To the contrary, on top of the P-type silicon region 14 (for NMOS), the gate electrode material of W has a lower work function of about 4.1~4.55 eV. The present invention thus allows the formation of gate electrodes for both PMOS and NMOS in the same fabrication process.

Another added benefit for the present invention novel method is the use of $WN_x$ which has superior surface adhesion and low resistance with the gate dielectric layer. Even though the gate electrode material on top of NMOS changes from $WN_x$ to W after annealing, good adhesion and low resistance are still maintained since a thin layer of about 5~20 Å of $WN_x$ still remains at the interface between the gate electrode and the gate dielectric.

Figure 1C:
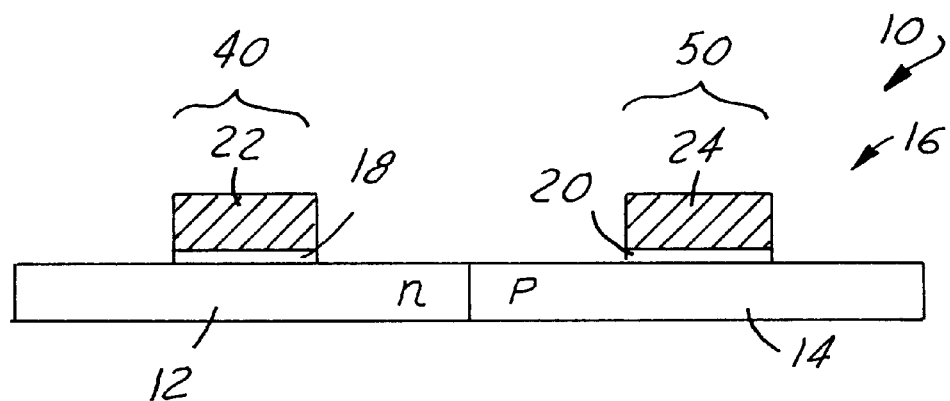
FIG. 1C is an enlarged, cross-sectional view of the present invention deep sub-micron CMOS device of FIG. 1B with the annealing process completed and the cap layer removed from the PMOS, while the metal gate on NMOS is converted to pure transition metal.

The present invention novel method for fabricating metal gates in deep sub-micron CMOS devices has therefore been amply described in the above description and in the appended drawings of FIGS. 1A–1C.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for fabricating metal gates in deep sub-micron CMOS devices comprising the steps of:
   providing a pre-processed silicon substrate having an active area on a top surface, said active area comprises a PMOS and an NMOS;
   depositing a gate dielectric layer on said active area of the silicon substrate;
   blanket depositing a transition metal nitride on said top surface of the substrate;
   patterning said transition metal nitride to cover said gate dielectric layer only;
   depositing and patterning a cap layer on top of said PMOS;
   annealing said substrate by a rapid thermal process (RTP) at a temperature between about 300° C. and about 700° C., whereby nitrogen evaporates away from said transition metal nitride that is not shielded by said cap layer such that only a transition metal covers said NMOS; and
   removing said cap layer from top of said PMOS.

2. A method for fabricating metal gates in deep sub-micron CMOS devices according to claim 1 further comprising the step of planarizing the transition metal nitride and the transition metal by chemical mechanical polishing after the cap layer is removed.

3. A method for fabricating metal gates in deep sub-micron CMOS devices according to claim 1, wherein said gate dielectric layer is deposited from a material selected from the group consisting of silicon oxide, silicon oxynitride and silicon nitride.

4. A method for fabricating metal gates in deep sub-micron CMOS devices according to claim 1 further comprising the step of depositing the transition metal nitride by a physical vapor deposition technique.

5. A method for fabricating metal gates in deep sub-micron CMOS devices according to claim 1 further comprising the step of depositing $WN_x$ as the transition metal nitride by a chemical vapor deposition technique.

6. A method for fabricating metal gates in deep sub-micron CMOS devices according to claim 1 further comprising the step of depositing the transition metal nitride by a chemical vapor deposition technique.

7. A method for fabricating metal gates in deep sub-micron CMOS devices according to claim 1 further comprising the step of depositing the cap layer by a plasma enhanced chemical vapor deposition technique.

8. A method for fabricating metal gates in deep sub-micron CMOS devices according to claim 1 further comprising the step of depositing the cap layer with a material selected from the group consisting of $Si_3N_4$, SiC, $SiO_2$ and SiON.

9. A method for fabricating metal gates in deep sub-micron CMOS devices according to claim 1 further comprising the step of annealing the transition metal nitride layer by a rapid thermal process in a vacuum environment.

10. A method for fabricating metal gates in deep sub-micron CMOS devices according to claim 1 further comprising the step of annealing the transition metal nitride layer in an inert gas atmosphere.

11. A method for fabricating metal gates in deep sub-micron CMOS devices according to claim 10, wherein said inert gas is selected from the group consisting of $N_2$, He and Ar.

12. A method for fabricating metal gates in deep sub-micron CMOS devices according to claim 1 further comprising the step of annealing the transition metal nitride by a rapid thermal process for a time period between about 1.5 min. and about 20 min.

13. A method for fabricating metal gates in deep sub-micron CMOS devices according to claim 1, wherein said transition metal nitride comprises a transition metal selected from the group consisting of Sc, Ti, V, Cr, Mn, Fe, Co, Ni, Cu, Y, Cr, Nb, Mo, Tc, Ru, Rh, Pd, Ag, La, Hf, Ta, W, Re, Os, Ir, Pt and Au.

* * * * *